(12) United States Patent
Savastiouk et al.

(10) Patent No.: US 9,111,902 B2
(45) Date of Patent: *Aug. 18, 2015

(54) DIELECTRIC TRENCHES, NICKEL/TANTALUM OXIDE STRUCTURES, AND CHEMICAL MECHANICAL POLISHING TECHNIQUES

(71) Applicant: Invensas Corporation, San Jose, CA (US)

(72) Inventors: Sergey Savastiouk, San Jose, CA (US); Valentin Kosenko, Palo Alto, CA (US); James J. Roman, Sunnyvale, CA (US)

(73) Assignee: Invensas Corporation, San Jose, CA (US)

( * ) Notice: Subject to any disclaimer, the term of this patent is extended or adjusted under 35 U.S.C. 154(b) by 28 days.

This patent is subject to a terminal disclaimer.

(21) Appl. No.: 14/160,129

(22) Filed: Jan. 21, 2014

(65) Prior Publication Data

US 2014/0131836 A1 May 15, 2014

Related U.S. Application Data

(60) Continuation of application No. 11/866,186, filed on Oct. 2, 2007, now Pat. No. 8,633,589, which is a division of application No. 11/418,801, filed on May 5, 2006, now Pat. No. 7,510,928.

(51) Int. Cl.
*H01L 23/48* (2006.01)
*H01L 49/02* (2006.01)
(Continued)

(52) U.S. Cl.
CPC .............. *H01L 28/40* (2013.01); *H01L 21/486* (2013.01); *H01L 21/4857* (2013.01);
(Continued)

(58) Field of Classification Search
CPC ............ H01L 21/76224; H01L 23/481; H01L 21/768; H01L 21/76831; H01L 21/76898; H01L 21/4857; H01L 21/486; H01L 2224/16; H01L 2224/16235; H01L 23/49822; H01L 23/49827; H01L 23/50; H01L 23/5223; H01L 23/53238; H01L 28/40; H01L 2924/01019
USPC .................................. 257/750–776
See application file for complete search history.

(56) References Cited

U.S. PATENT DOCUMENTS 3,969,197 A  7/1976  Tolar et al.
5,767,001 A  6/1998  Bertagnolli et al.
(Continued)

OTHER PUBLICATIONS

International Search Report, PCT/US07/68051, mailing date Mar. 4, 2008.
(Continued)

*Primary Examiner* — H Tsai
(74) *Attorney, Agent, or Firm* — Haynes and Boone LLP

(57) ABSTRACT

A portion of a conductive layer (310, 910) provides a capacitor electrode (310.0, 910.0). Dielectric trenches (410, 414, 510) are formed in the conductive layer to insulate the capacitor electrode from those portions of the conductive layer which are used for conductive paths passing through the electrode but insulated from the electrode. Capacitor dielectric (320) can be formed by anodizing tantalum while a nickel layer (314) protects an underlying copper (310) from the anodizing solution. This protection allows the tantalum layer to be made thin to obtain large capacitance. Chemical mechanical polishing of a layer (610) is made faster, and hence possibly less expensive, by first patterning the layer photolithographically to form, and/or increase in height, upward protrusions of this layer.

11 Claims, 11 Drawing Sheets

(51) Int. Cl.
  *H01L 21/48*   (2006.01)
  *H01L 23/498*  (2006.01)
  *H01L 23/50*   (2006.01)
  *H01L 23/522*  (2006.01)
  *H01L 23/532*  (2006.01)

(52) U.S. Cl.
  CPC ... *H01L 23/49822* (2013.01); *H01L 23/49827* (2013.01); *H01L 23/50* (2013.01); *H01L 23/5223* (2013.01); *H01L 23/53238* (2013.01); *H01L 2224/16* (2013.01); *H01L 2224/16235* (2013.01); *H01L 2924/01019* (2013.01); *H01L 2924/01057* (2013.01); *H01L 2924/01068* (2013.01); *H01L 2924/3025* (2013.01)

(56) References Cited

U.S. PATENT DOCUMENTS

| | | |
|---|---|---|
| 5,846,879 A | 12/1998 | Winnerl et al. |
| 5,910,687 A | 6/1999 | Chen et al. |
| 5,930,644 A | 7/1999 | Tsai et al. |
| 6,143,646 A | 11/2000 | Wetzel |
| 6,184,060 B1 | 2/2001 | Siniaguine |
| 6,245,635 B1 | 6/2001 | Lee |
| 6,322,903 B1 | 11/2001 | Siniaguine et al. |
| 6,323,103 B1 | 11/2001 | Rengarajan et al. |
| 6,404,615 B1 | 6/2002 | Wijeyesekera et al. |
| 6,593,210 B1 | 7/2003 | Rangarajan et al. |
| 6,608,259 B1 | 8/2003 | Norskov |
| 6,740,588 B1 | 5/2004 | Kouty, Jr. |
| 6,875,921 B1 | 4/2005 | Conn |
| 6,897,148 B2 | 5/2005 | Halahan et al. |
| 6,943,108 B2 | 9/2005 | Farooq et al. |
| 6,962,867 B2 | 11/2005 | Jackson et al. |
| 6,970,362 B1 | 11/2005 | Chakravorty |
| 6,982,225 B2 | 1/2006 | Bohr |
| 7,510,928 B2 | 3/2009 | Savastiouk et al. |
| 8,633,589 B2 * | 1/2014 | Savastiouk et al. ........... 257/758 |
| 2002/0043399 A1 | 4/2002 | Sasaki et al. |
| 2003/0162386 A1 | 8/2003 | Ogawa et al. |
| 2004/0113235 A1 | 6/2004 | Coolbaugh et al. |
| 2004/0147106 A1 | 7/2004 | Okada |
| 2004/0180540 A1 | 9/2004 | Yamasaki et al. |
| 2005/0263874 A1 | 12/2005 | Shimizu et al. |
| 2006/0141766 A1 | 6/2006 | Kim |

OTHER PUBLICATIONS

Written Opinion of the International Searching Authority, PCT/US07/68051.

Ho, Johnny; Kim, Meekyung; Santala, Melissa, "Tantalum Nitride Barrier Layer in Copper-based ICs" pp. 1-3.

Office Action dated Nov. 3, 2010 in U.S. Appl. No. 12/196,065, 11 pages.

* cited by examiner

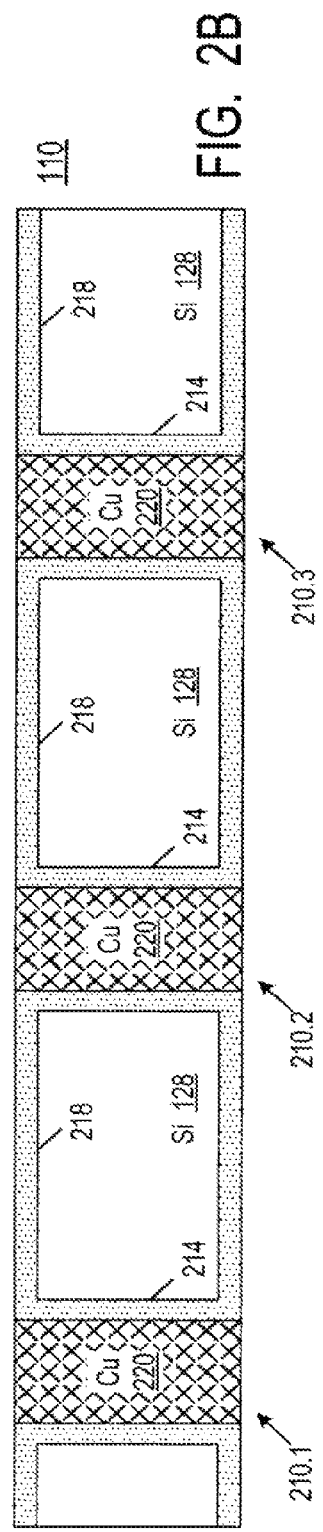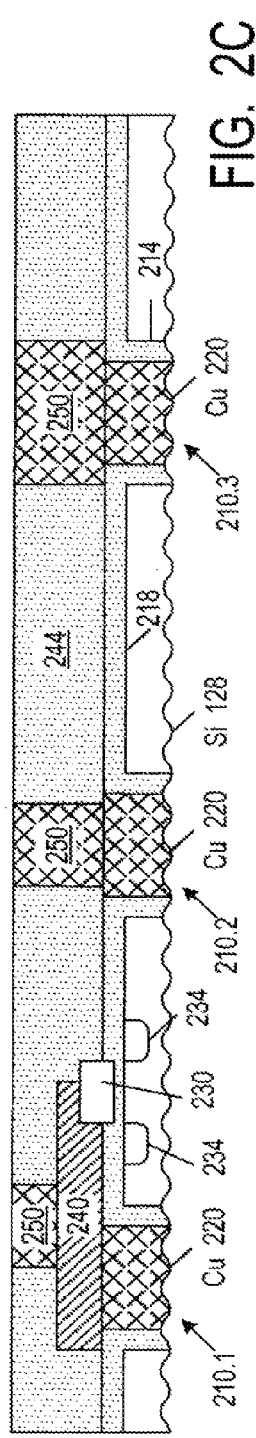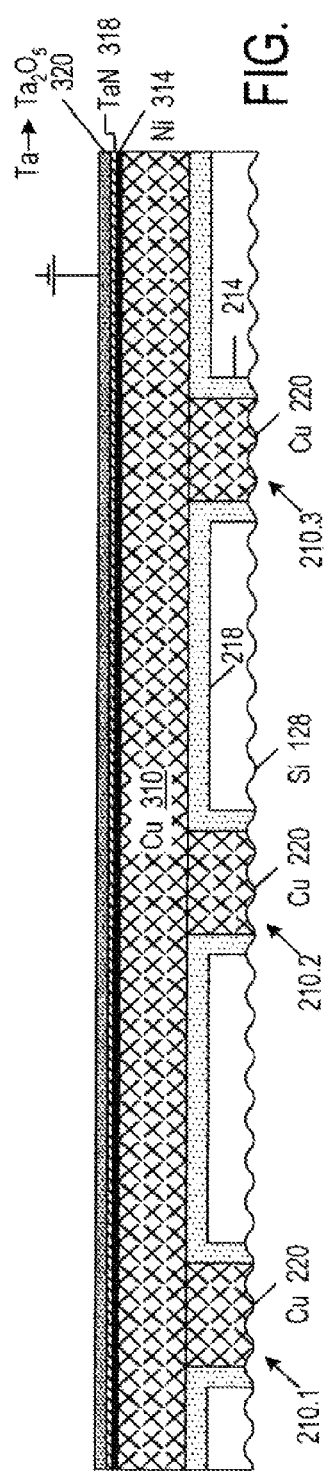

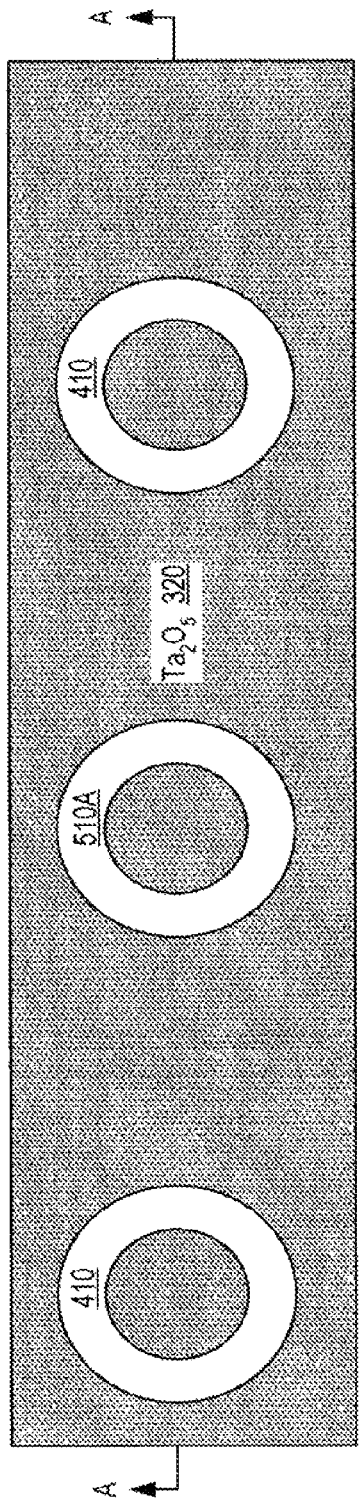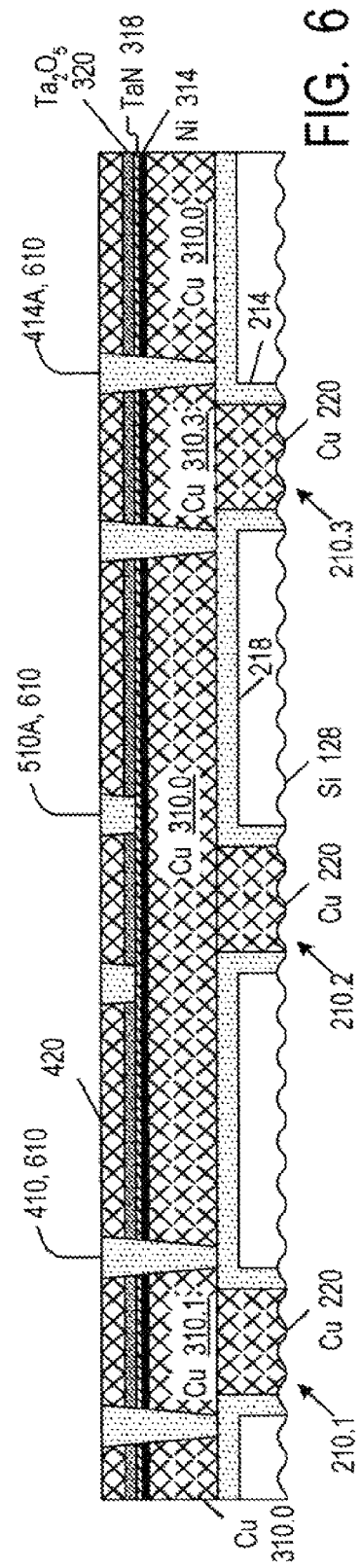

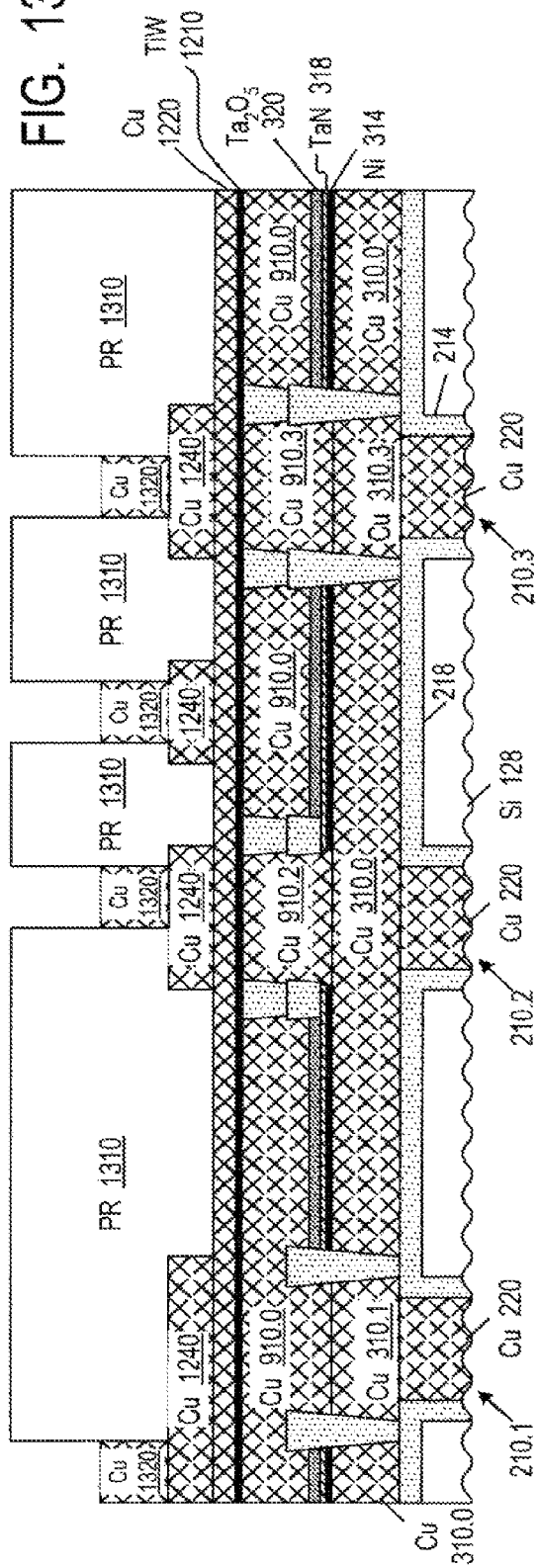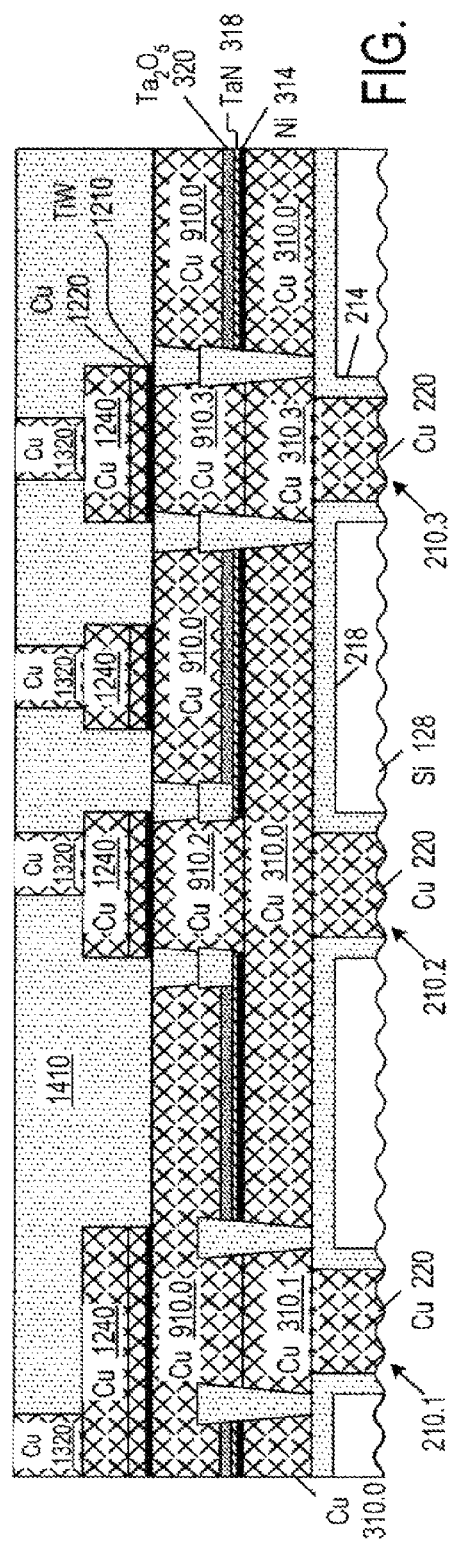

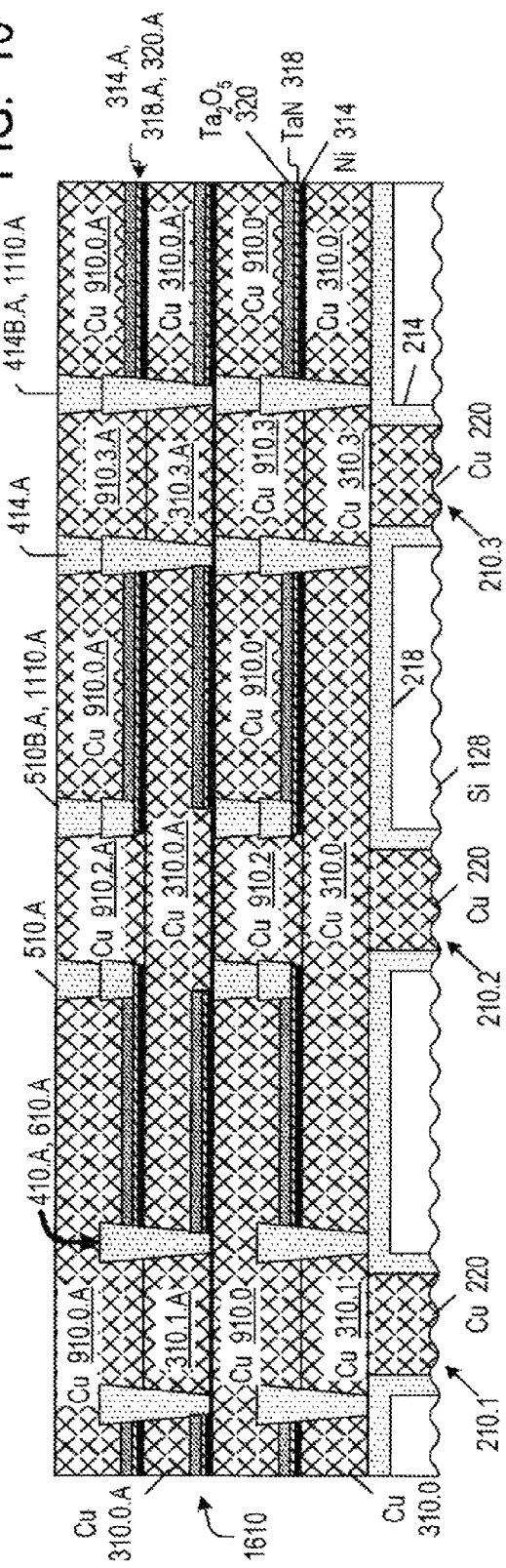
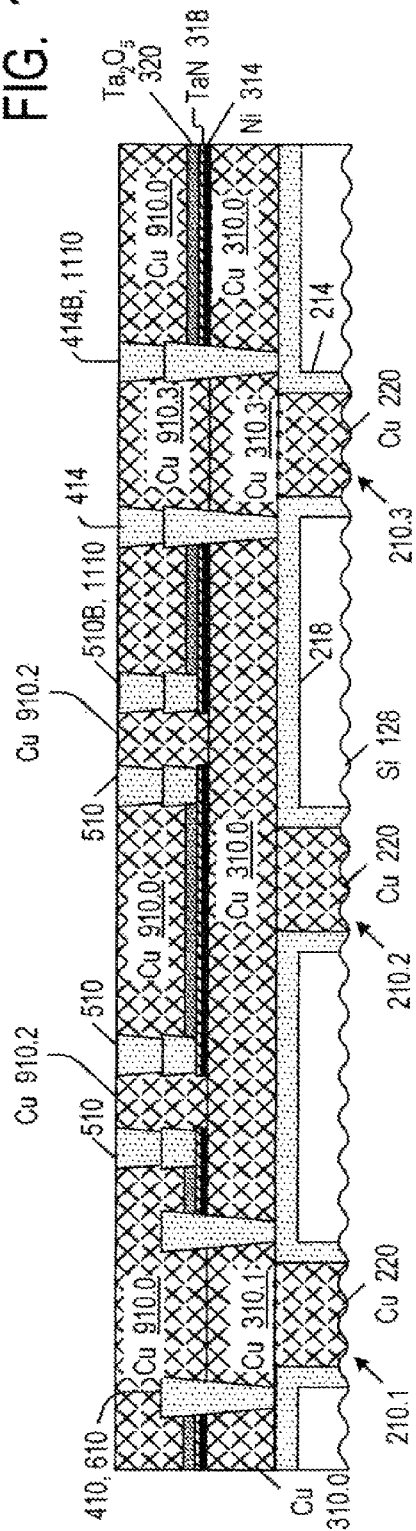

DIELECTRIC TRENCHES, NICKEL/TANTALUM OXIDE STRUCTURES, AND CHEMICAL MECHANICAL POLISHING TECHNIQUES

CROSS REFERENCE TO RELATED APPLICATIONS

The present application is a continuation of U.S. patent application Ser. No. 11/866,186, filed Oct. 2, 2007 (now U.S. Pat. No. 8,633,589), which is a division of U.S. patent application Ser. No. 11/418,801, filed May 5, 2006 (now U.S. Pat. No. 7,510,928), both incorporated herein by reference.

BACKGROUND OF THE INVENTION

The present invention relates to fabrication of dielectric and conductive features. In some embodiments, the conductive features provide decoupling capacitors or ground planes for interposers for integrated circuits. The present invention also relates to chemical mechanical polishing (CMP).

Decoupling capacitors can be connected between the power and ground terminals of an integrated circuit to filter out power supply noise or provide a charge reservoir for power consumption variations. The decoupling capacitor should be placed as close as possible to the integrated circuit's power and ground inputs in order to reduce the parasitic inductance. To meet this placement objective, the capacitor can be manufactured in an interposer 110 (FIG. 1) soldered between the integrated circuit 120 and a ceramic chip carrier 124. In this example, the interposer is itself an integrated circuit, manufactured on a silicon wafer 128. Silicon oxide 132 is formed on wafer 128. Conductive layer 136, dielectric 140, and another conductive layer 144 are formed on oxide 132. Layers 136, 140, 144 are patterned to provide a decoupling capacitor 150. Additional dielectric 156 is deposited over the structure. Vias 164, 168 are formed in dielectric 156 to allow contact to the respective capacitor plates 136, 144. Vias 164, 168 are filled with metal. Vias 174, 178 are made through the interposer and filled with metal. These vias are electrically connected to the metallized vias 164, 168. Vias 174, 178 receive respective power and ground signals from chip carrier 124 and provide these signals to IC 120. Additional metallized vias 182 pass through the interposer and provide signal paths between chip carrier 124 and IC 120. The interposer is soldered to IC 120 and ceramic substrate 124 with solder balls 186. See U.S. Pat. No. 6,943,108 B2 issued Sep. 13, 2005 to Farooq et al. and incorporated herein by reference.

Alternative fabrication techniques and structures are desirable for decoupling capacitors and other conductive and dielectric features of interposers and other structures.

SUMMARY

This section summarizes some features of the invention. Other features are described in the subsequent sections. The invention is defined by the appended claims which are incorporated into this section by reference.

The area and placement of capacitor 150 in FIG. 1 are limited by the conductive paths 174, 178, 182. In some embodiments of the present invention, these limitations are relaxed because the conductive paths pass through the capacitor plates. The conductive paths can be insulated from one or both of the capacitor plates. In some embodiments, the capacitor plates cover the whole area of the silicon substrate except for the conductive paths. If a conductive path must be insulated from a capacitor plate, the path is formed as follows. A circular dielectric trench is formed in the metal layer providing the capacitor plate. The metal portion surrounded by the trench is used for the conductive path. The metal portion outside of the trench is used for the capacitor plate. A large capacitor plate area is achieved as a result.

In some embodiments, an interposer includes multiple capacitors. The capacitors can be connected in parallel. Capacitors connected in parallel in a ceramic substrate are described in U.S. Pat. No. 6,970,362 B1 issued Nov. 29, 2005 to Chakravorty, incorporated herein by reference. According to some embodiments of the present invention, similar capacitors can be formed using the dielectric trench technology described above. This technology can be used to form interposers containing a semiconductor substrate. Interposers containing a semiconductor substrate are more suitable for some applications than ceramic interposers for reasons related to thermal expansion coefficients, feature sizes obtainable with integrated circuit fabrication technology, and possibly other reasons. The invention is not limited to interposers with semiconductor substrates however.

The techniques described above are also suitable to manufacture ground and power planes and other conductive features.

Another aspect of the present invention relates to fabrication of dielectric. Such dielectric can be used as capacitor dielectric in some embodiments. A thin, uniform dielectric layer with a high dielectric constant ("high-K") is desirable to provide reproducibly high capacitance without leakage. Some embodiments of the invention use tantalum pentoxide ($Ta_2O_5$). In some embodiments, this dielectric is formed over the bottom capacitor electrode by depositing and anodizing a tantalum layer. A thin, uniform, non-leaky tantalum pentoxide layer is achieved using a barrier layer between the tantalum layer and the bottom electrode to stop the anodization of tantalum. For example, in some embodiments, the bottom electrode is copper and the barrier layer is nickel. The nickel layer does not get anodized even if the tantalum layer has pinholes allowing the anodizing solution to ooze through the tantalum. This tolerance to the tantalum layer imperfections allows the tantalum layer, and hence the tantalum pentoxide, to be made thin.

Another aspect of the invention relates to chemical mechanical polishing (CMP). To reduce the time required to polish a layer (e.g. polyimide), the layer is first patterned photolithographically to form a number of protruding features (and/or increase the height of the protruding features). Then the CMP is applied. The protruding features are polished faster than would be required for polishing the original layer in some cases, e.g. if the original layer had a planar top surface.

The invention is not limited to the embodiments described above. The dielectric layers and the CMP techniques described above can be used for non-capacitor purposes. Other features are within the scope of the invention, as defined by the appended claims.

BRIEF DESCRIPTION OF THE DRAWINGS

FIGS. 2A, 2B, 2C, 3, 4A illustrate vertical cross sections of an interposer in the process of fabrication according to some embodiments of the present invention.

FIG. 5B is a top view of an interposer in the process of fabrication according to some embodiments of the present invention.

FIGS. 6, 7, 8A illustrate vertical cross sections of an interposer in the process of fabrication according to some embodiments of the present invention.

FIGS. 11-14 illustrate vertical cross sections of an interposer in the process of fabrication according to some embodiments of the present invention.

FIGS. 16, 17 illustrate vertical cross sections of interposers in the process of fabrication according to some embodiments of the present invention.

DESCRIPTION OF SOME EMBODIMENTS

The embodiments described in this section illustrate but do not limit the invention. Particular dimensions, materials, and fabrication techniques are specified to illustrate particular embodiments rather than limit the invention. The invention is defined by the appended claims.

Figure 2A:
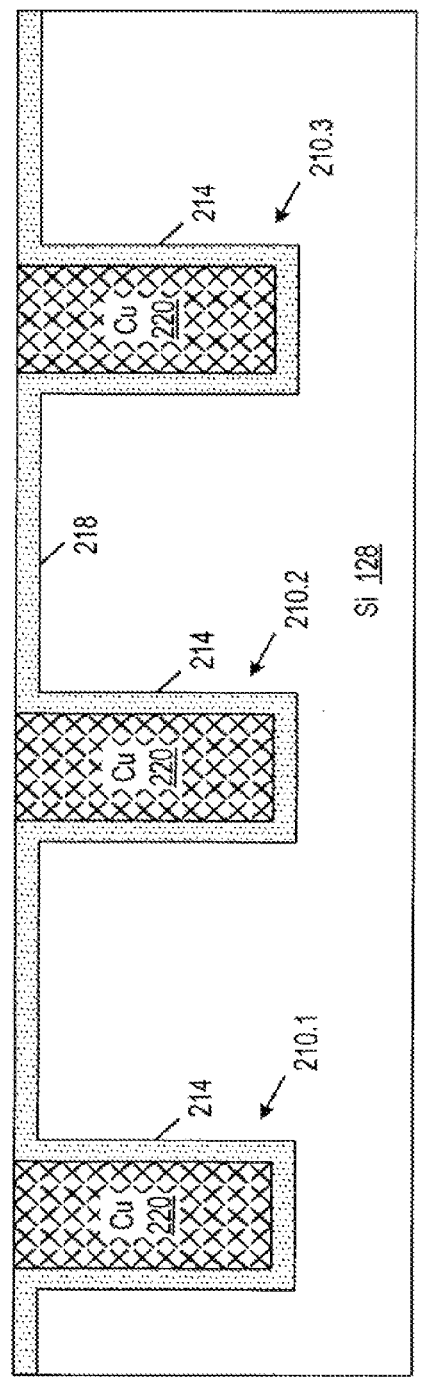

FIG. 2A illustrates an intermediate stage in fabrication of an interposer 110 according to some embodiments of the present invention. The interposer is shown before capacitor fabrication. Trenches (holes) 210 (i.e. 210.1, 210.2, 210.3) have been made in a substrate 128. Substrate 128 is an insulating substrate or a semiconductor substrate. In one embodiment, substrate 128 is a monocrystalline silicon wafer. If substrate 128 is a semiconductor substrate, the trenches are lined up with a dielectric 214 (e.g. silicon dioxide), and further dielectric 218 (e.g. silicon dioxide) is formed on substrate 128 between the trenches. The trenches are filled with a conductive material 220, e.g. copper. Other materials can also be used. A planar top surface can be provided, but this is not necessary.

Figure 1:
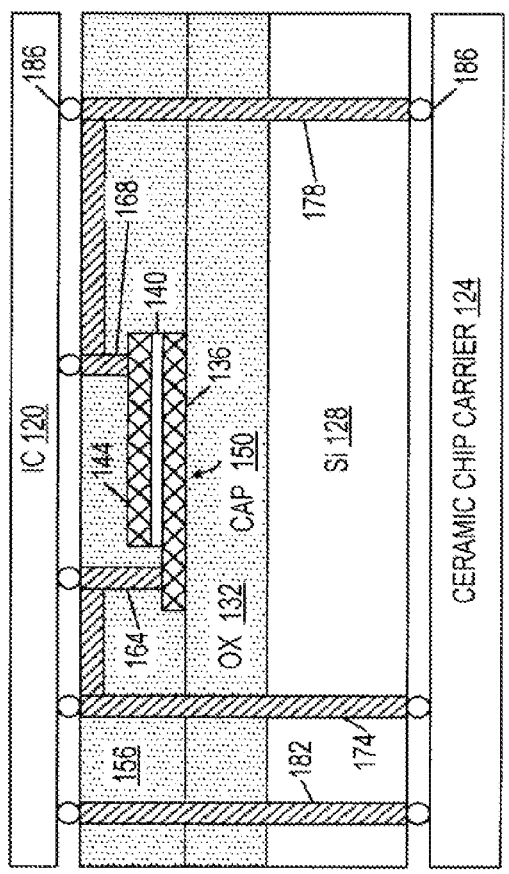
FIG. 1 illustrates a vertical cross section of a prior art interposer.

Later, the structure will be etched from the bottom to expose the copper 220. Copper 220 will provide contact pads suitable for attachment to a ceramic chip carrier 124 of FIG. 1 or to some other structure, e.g. a BT (bis-maleimide triazine) wiring substrate or some other printed circuit board, or to another semiconductor integrated circuit (possibly another interposer).

Alternatively, the initial structure can be as in FIG. 2B, with through-holes 210 made in substrate 128 and filled with conductive material 220. Dielectric 218 covers the surfaces of substrate 128 and separates the substrate from conductor 220 in the through-holes. The structure of FIG. 2B can be created using known techniques. In one embodiment, holes 210 are etched through monocrystalline silicon substrate 128 by a deep reactive ion etching process. Then silicon dioxide 218 is grown by thermal oxidation. Then a barrier metal and a copper seed layer are deposited over the top and/or the bottom of the structure, and copper is electroplated into the holes 210. The copper and the barrier metal are etched away outside the holes. This embodiment is not limiting.

The bottom capacitor plate layer 310 (FIG. 3) can be formed directly on the structure of FIG. 2A or 2B. Alternatively, other features can be fabricated before the capacitor plate, as shown in FIG. 2C. In this example, the interposer has been processed to form a transistor with a gate 230 and source/drain regions 234. A conductive interconnect 240 has been formed to connect the transistor gate to the metal 220 in trench 210.1. Dielectric 244 has been deposited. Openings have been formed in the dielectric and filled with a conductive material 250. Other devices (e.g. resistors) and multi-layer interconnect structures can also be formed before the capacitor. Moreover, trenches 210 can be formed after the fabrication of transistors and other features, and even after the capacitor fabrication. See e.g. the following U.S. patents incorporated herein by reference: U.S. Pat. No. 5,846,879 issued Dec. 8, 1998 to Winnerl et al.; No. 5,767,001 issued Jun. 16, 1998 to Bertagnolli et al.; No. 6,184,060 issued Feb. 6, 2001 to Siniaguine; No. 6,322,903 issued Nov. 27, 2001 to Siniaguine et al.; No. 6,897,148 issued May 24, 2005 to Halahan et al. Detailed description below is given for the capacitor formed directly on the structure of FIG. 2A. The cases of FIGS. 2B, 2C and the case of forming the trenches after the capacitor fabrication are similar.

Conductive layer 310 (FIG. 3) is deposited on the entire wafer. In one embodiment, layer 310 is formed by sputtering a copper layer to a thickness of 500 nm, and then electroplating additional copper to a obtain a total thickness of about 3 μm. In the electroplating operation, the negative potential can be coupled to the seed layer at the wafer edges. As noted above, these dimensions, materials, and deposition techniques are exemplary and not limiting.

A barrier nickel layer 314 is deposited (e.g. sputtered or electroplated) over the entire wafer on copper 310 to an exemplary thickness of 250 nm. Another barrier layer 318 of tantalum nitride (TaN) is deposited (by sputtering or physical vapor deposition (PVD)) on nickel 314 to an exemplary thickness of 500 nm. Tantalum nitride 318 will block copper diffusion upwards into the tantalum pentoxide layer to be formed on top.

A tantalum layer 320 is deposited (e.g. sputtered) on tantalum nitride 318 to an exemplary thickness of 300 nm. This process and thickness do not guarantee defect-free deposition. In particular, pinholes can be present in the tantalum layer.

The wafer is placed into an anodizing bath. Since tantalum 320 is a conductive layer covering the entire wafer, the positive potential can be coupled to the tantalum at the wafer edges and/or at any other part of the wafer. The anodizing process converts the tantalum into a 150 nm thick, uniform layer of tantalum pentoxide ($Ta_2O_5$). This layer is marked in the drawings with the same numeral 320 as the original tantalum layer. Nickel 314 stops the anodization, protecting the copper layer 310 if there are imperfections in the tantalum layer. Copper advantageously provides low resistance. The bottom capacitor electrode will be formed from the stack of layers 310, 314, 318. (We use the terms "capacitor electrode" and "capacitor plate" interchangeably.)

Figure 4A:
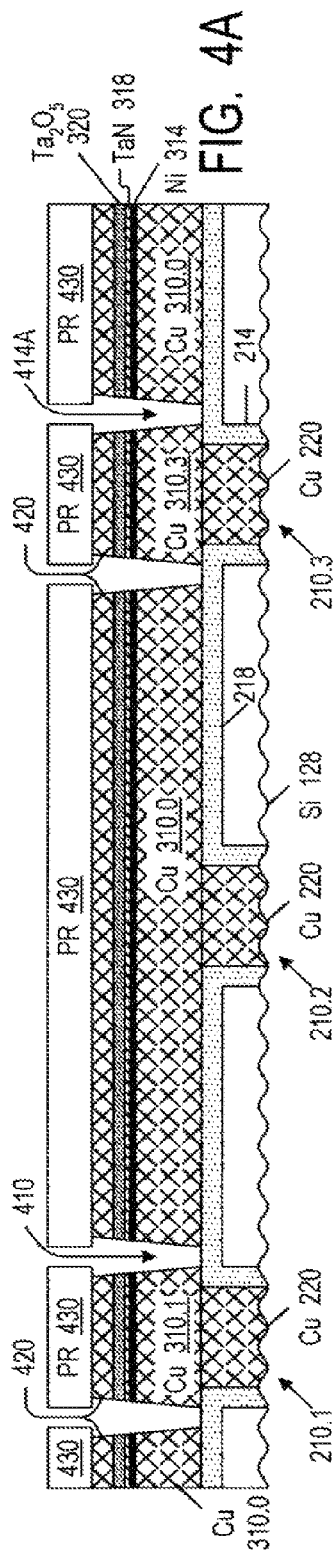
Figure 4B:
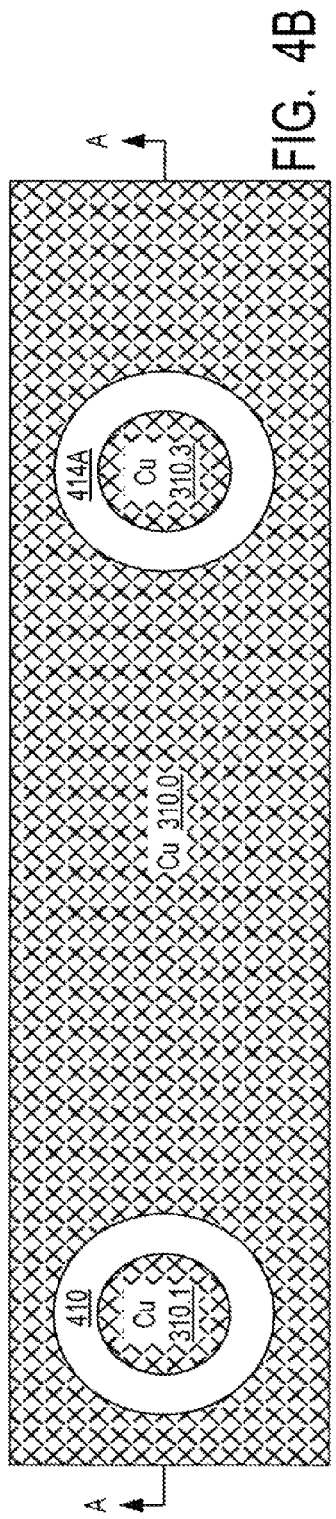
FIG. 4B is a top view of an interposer in the process of fabrication according to some embodiments of the present invention.

Trenches 410, 414A (FIGS. 4A, 4B) are formed in layer 310, 314, 318, 320 to insulate the bottom capacitor electrode from the metal portions reserved for conductive paths passing through the electrode. FIG. 4A shows the same cross section as FIG. 3. This cross section is marked "A-A" in the top view of FIG. 4B. The layers overlying the copper 310 have been omitted in FIG. 4B. The bottom electrode will be provided by a portion 310.0 of layer 310 and by the overlying portions of nickel 314 and TaN 318. The etch of trenches 410, 414A stops on dielectric 218. Trench 410 laterally surrounds a portion 310.1 of copper layer 310 and also laterally surrounds the overlying portions of layers 314, 318. In top view, the trench 410 laterally surrounds the underlying copper 220 in hole 210.1. The metallized hole 210.1 will be insulated from the bottom electrode by trench 410 and will be connected to the top capacitor electrode (not yet formed). Multiple trenches 410 can be made at the same time, for connecting multiple metallized holes 210 to the top electrode. Trench 414A laterally surrounds a portion 310.3 of layer 310 and also laterally surrounds the overlying portions of layers 314, 318 and the underlying copper 220 in hole 210.3. The metallized hole 210.3 will be insulated from the capacitor electrodes and will be part of a signal path going to the top of the interposer. Multiple trenches 414A can be made at the same time, for providing multiple signal paths between multiple metallized holes 210 and the top of the interposer. Copper 310.0 physically contacts the copper 220 in hole 210.2 and laterally surrounds each trench 410. Copper 310.0 laterally surrounds the whole wafer and each die on the wafer (in some embodiments, the interposer wafer will be separated into dies; in other embodiments, the wafer is not separated into dies). Trenches 410, 414A are separated from each other by copper 310.0 and the overlying portions of layers 314, 318. This geometry is not limiting. For example, adjacent trenches 410 and/or 414A may contact each other (i.e. may be merged into a single trench), and a trench 410 or 414A may surround multiple holes 210 rather than a single hole 210 as in FIGS. 4A, 4B.

Trenches 410, 414A can be formed as follows. First, an optional, sacrificial, protective layer 420 is formed on tantalum pentoxide 320 (layer 420 will protect the dielectric 320 in a subsequent CMP step described below). In some embodiments, layer 420 is copper sputtered to a 1 μm thickness. Photoresist 430 is deposited and patterned to define the trenches. Layers 320, 318, 314, 310 are etched through the photoresist openings to form the trenches 410, 414A. In this procedure, tantalum pentoxide 320 is etched by a plasma etch. Then tantalum nitride 318 is etched by a plasma etch. Then nickel 314 is etched by a wet etch. Finally, copper 310 is etched by a wet etch. Photoresist 430 is then stripped.

Figure 5A:
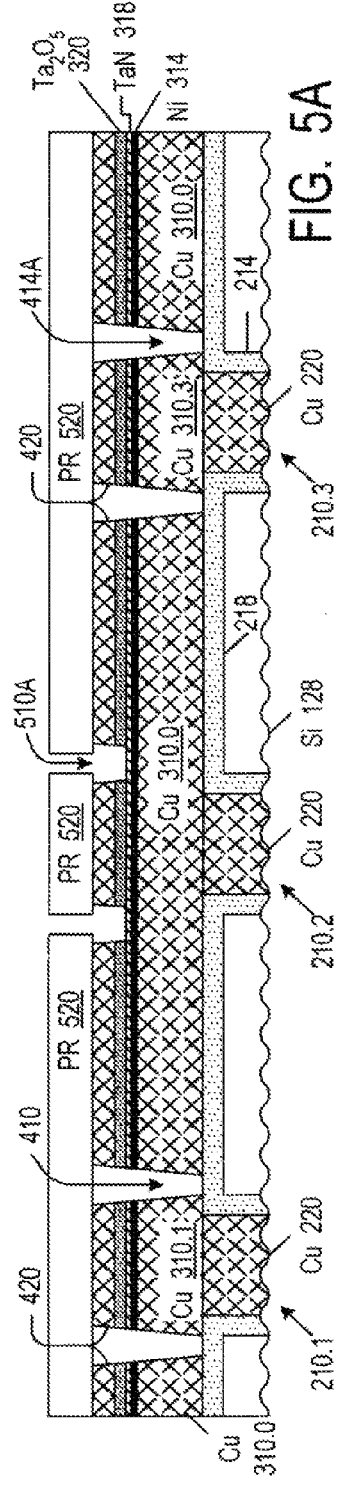
FIG. 5A illustrates a vertical cross section of an interposer in the process of fabrication according to some embodiments of the present invention.

Optional trenches 510A (FIGS. 5A, 5B) are formed in dielectric 320 and copper 420. FIG. 5A shows the same cross section as FIG. 4A. This cross section is marked "A-A" in the top view of FIG. 5B. Only one trench 510A is shown, but many such trenches may be present. Trench 510A is formed above the copper 310.0. In top view, trench 510A laterally surrounds the copper 220 in trench 210.2, and will help insulate the metallized trench 220.2 from the top capacitor electrode as described below.

Trenches 510A are formed by depositing a photoresist layer 520 (FIG. 5A), patterning the resist to define the trenches 510A, and etching the layers 420, 320 to form the trenches 510A. Photoresist 520 is shown to have a planar bottom surface (this could be a dry tape resist), but the photoresist could fill the trenches 410, 414A. In some embodiments, copper 420 is etched by a wet etch, and then tantalum pentoxide 320 and TaN 318 are etched by a plasma etch. The etch stops on Ni layer 314, or may be terminated before etching through TaN 318 (as shown in FIG. 5A). In other embodiments, the etch continues and stops on copper 310. Photoresist 520 is then removed.

Trenches 410, 414A, 510A are filled with a dielectric 610 (FIG. 6). In some embodiments, dielectric 610 is polyimide flown on top of the wafer, cured, and polished off the top of the wafer by chemical mechanical polishing (CMP) to provide a planar top surface. The CMP process stops on copper 420 to protect tantalum pentoxide 320.

Figure 7:
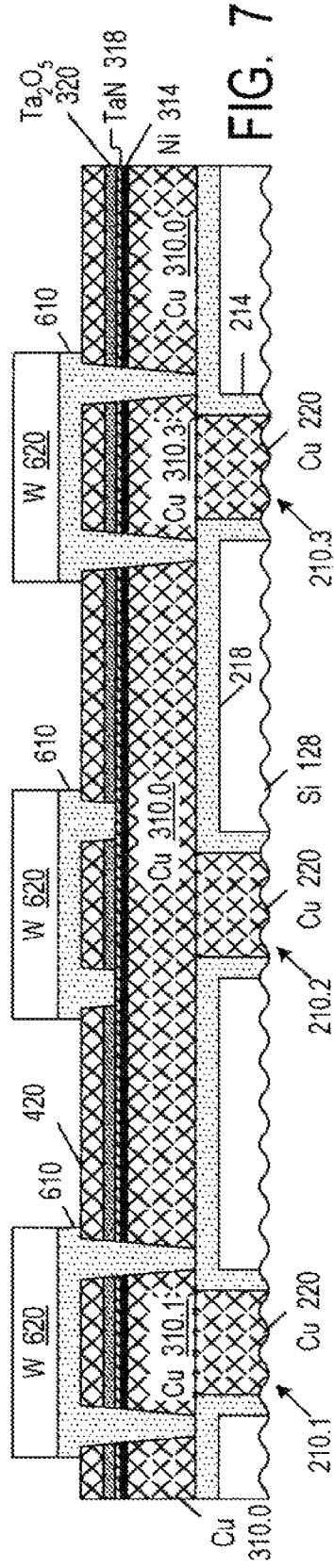

In some embodiments, the CMP process is sped up as illustrated in FIG. 7. After the polyimide deposition, a hard mask layer 620 (e.g. tungsten) is deposited by sputtering to an exemplary thickness of 200 nm and patterned photolithographically (using a photoresist layer not shown in the drawings) to cover the trenches 410, 414A, 510, and possibly other selected areas. The polyimide portion exposed by the mask is etched away by a plasma etch to leave protruding polyimide/tungsten stacks. These protruding stacks are then polished off by CMP to provide the structure of FIG. 6. The CMP of these stacks takes less time than the CMP of a polyimide layer with a planar top surface as described above in connection with FIG. 6. The CMP cost, and hence the total fabrication cost, can be lowered as a result.

Figure 8A:
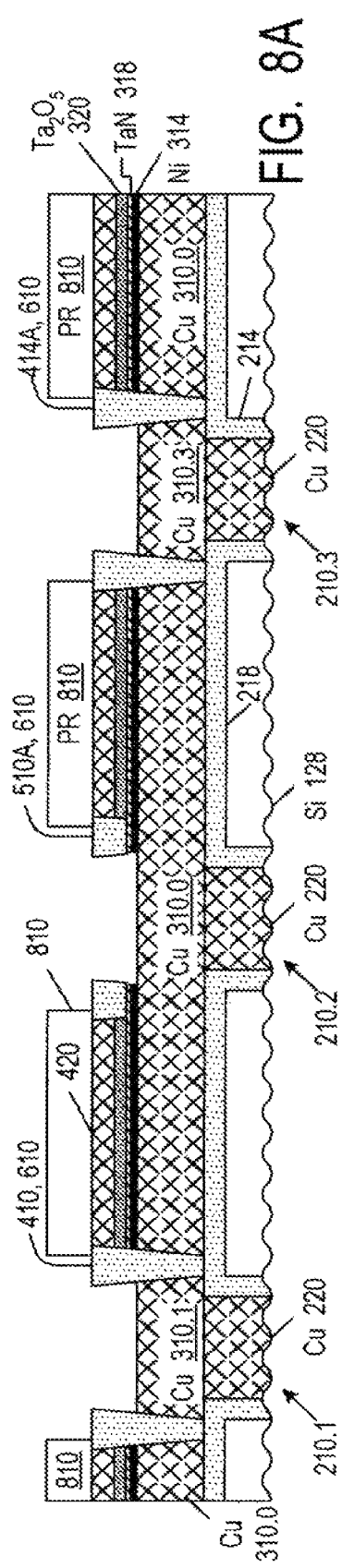
Figure 8B:
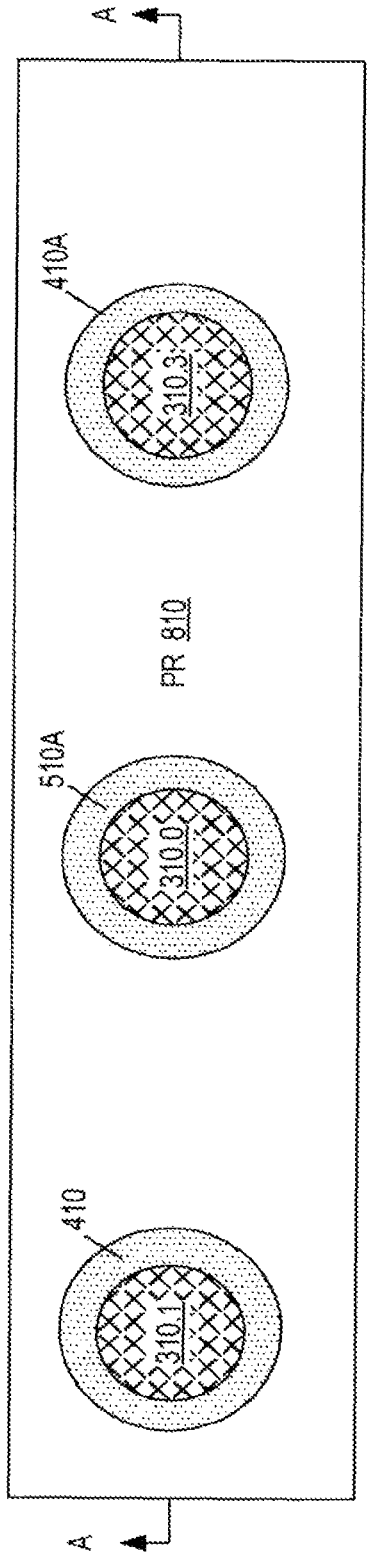
FIG. 8B is a top view of an interposer in the process of fabrication according to some embodiments of the present invention.

After the polyimide CMP, a photoresist layer 810 (FIGS. 8A, 8B) is formed on the wafer and patterned to expose the copper areas enclosed by dielectric trenches 410, 414A, 510A. FIG. 8A illustrates the vertical cross section marked "A-A in FIG. 8B. In FIGS. 8A, 8B the edges of the openings in mask 810 overlie the trenches 410, 414A, 510A so that all of copper 420 is exposed in the enclosed areas. In some embodiments, only part of copper 420 is exposed in the enclosed areas.

Copper 420 and tantalum pentoxide 320 are etched away in the areas enclosed by the trenches selectively to polyimide. In some embodiments, the copper is etched by a wet etch, and the tantalum pentoxide by a plasma etch. Tantalum nitride 318 and, possibly, nickel 314 can also be removed in these areas or can be left in place.

Figure 9:
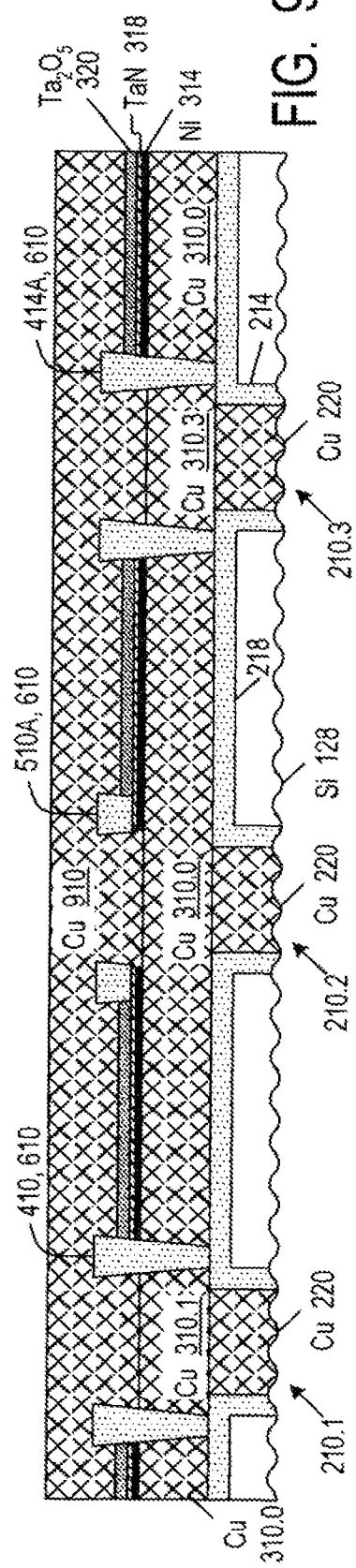
FIGS. 9, 10A illustrate vertical cross sections of an interposer in the process of fabrication according to some embodiments of the present invention.

Photoresist 810 is removed. Protective copper 420 is removed by a wet etch. Some of copper 310 in the areas enclosed by trenches 410, 414A, 510A can be removed during this step. A new copper layer 910 (FIG. 9) is deposited on the wafer to an exemplary thickness of 3 μm to provide the top capacitor electrode. The deposition can be performed by sputtering or a combination of sputtering and electroplating for example. Copper 910 contacts the bottom electrode in the areas enclosed by trenches 510A. Copper 910 is separated from the bottom electrode by tantalum pentoxide 320.

Figure 10A:
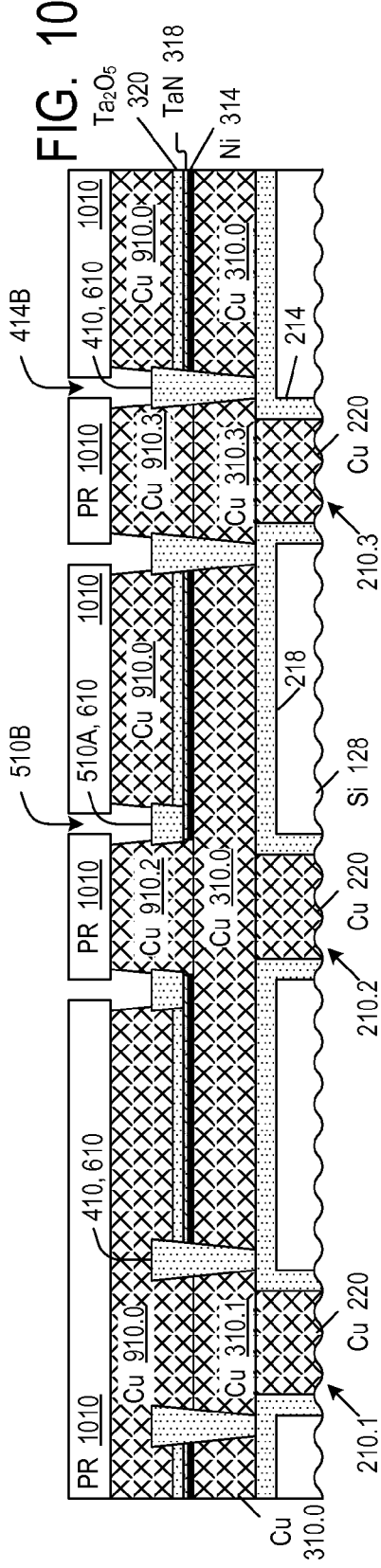
Figure 10B:
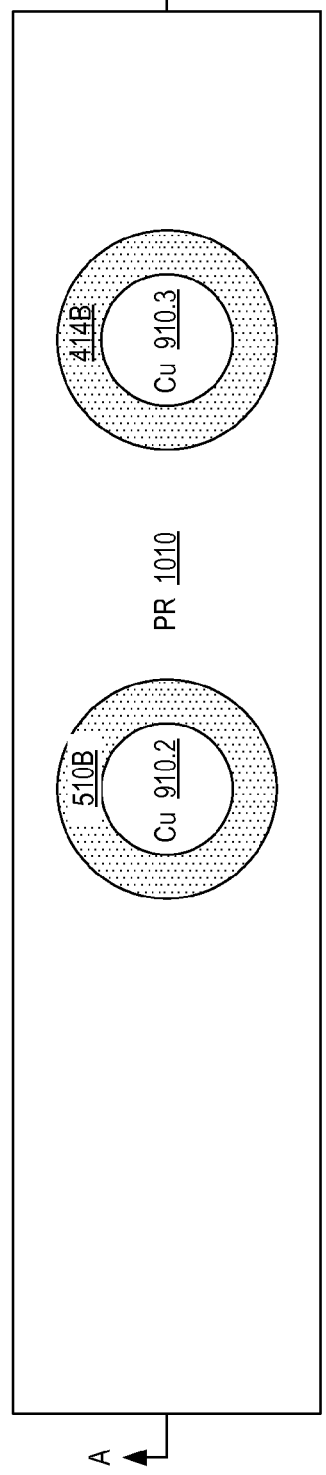
FIG. 10B is a top view of an interposer in the process of fabrication according to some embodiments of the present invention.

A photoresist layer 1010 (FIG. 10A) is formed on the wafer and patterned to define trenches 510B, 414B. FIG. 10B shows the top view of the structure. The cross section of FIG. 10A is marked as "A-A" in FIG. 10B. Copper 910 is etched through the photoresist openings to form the trenches 510B, 414B. A wet etch can be used for this purpose. The etch stops on polyimide 610. The top capacitor electrode is provided by a portion 910.0 of layer 910. Trench 510B overlies, and merges with, the trench 510A. Trench 510B laterally surrounds the copper 220 in hole 210.2. Trench 510B laterally surrounds a portion 910.2 of layer 910. Copper 910.2 physically contacts the copper 310.0. Trench 414B overlies, and merges with, the trench 414A. Trench 414B laterally surrounds the copper 220 in hole 210.3. Trench 414B laterally surrounds a portion 910.3 of layer 910. Copper 910.3 physically contacts the copper 310.3.

Resist 1010 is removed. Trenches 510B, 414B are filled with a dielectric 1110 (FIG. 11), e.g. polyimide. Trenches 510B, 510A merge into a single dielectric trench 510. Dielectric trenches 414B, 414A merge into a single dielectric trench 414.

In an alternate embodiment, trenches 414A, 510A are omitted at the stages of FIGS. 4A, 4B, 5A, 5B. The entire trenches 414, 510 are etched at the stage of FIGS. 10A, 10B, and filled with dielectric at the stage of FIG. 11. The use of trenches 414A, 510A simplifies the trench etch and fill at the stage of FIGS. 10A, 10B, 11 however.

Figure 11:
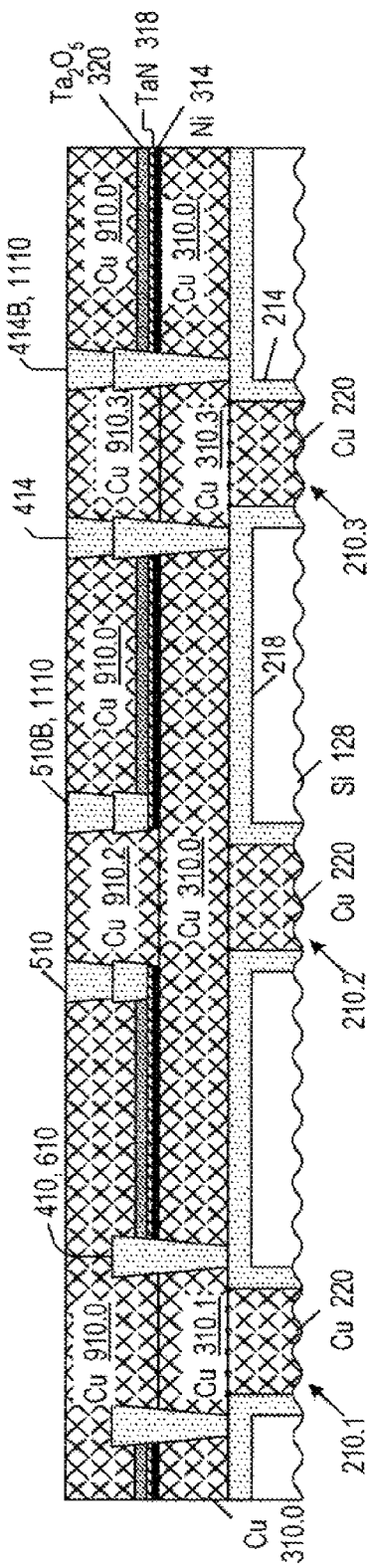

As shown in FIG. 11, the bottom capacitor electrode 310.0 is connected to the bottom of the interposer by the metallized hole 210.2 and to the top of the interposer through the copper 910.2. The top electrode 910.0 is connected to the bottom of the interposer by copper 310.1 and metallized hole 210.1. The metallized hole 210.3 is connected to the top of the interposer by copper 310.3, 910.3.

Figure 12:
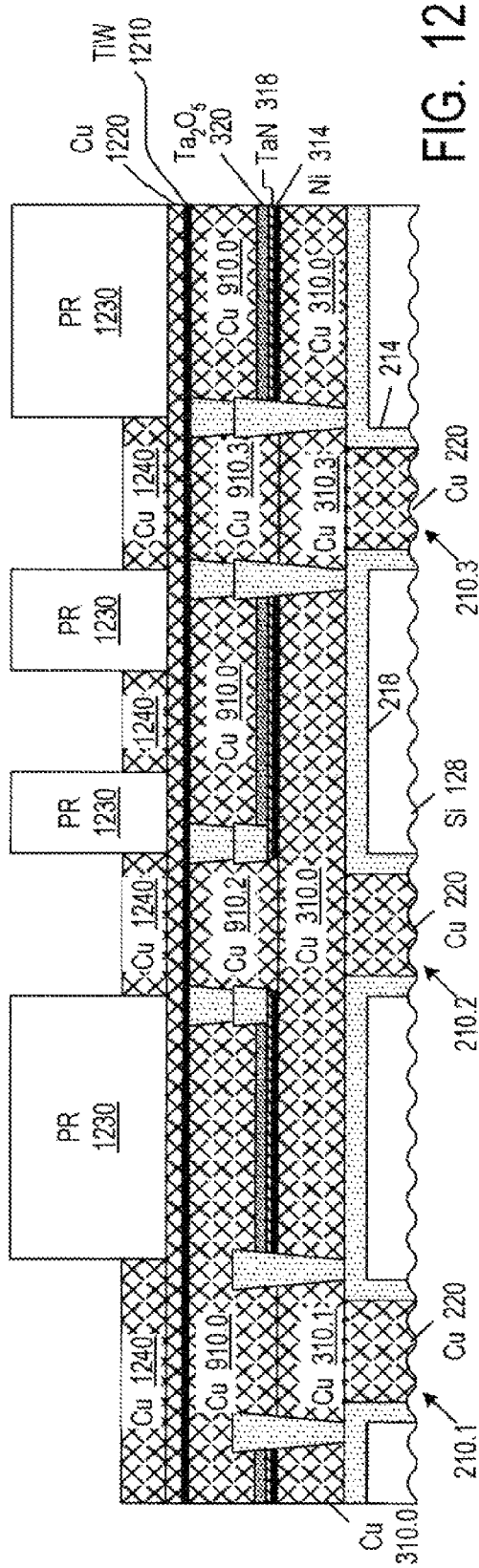
Figure 15:
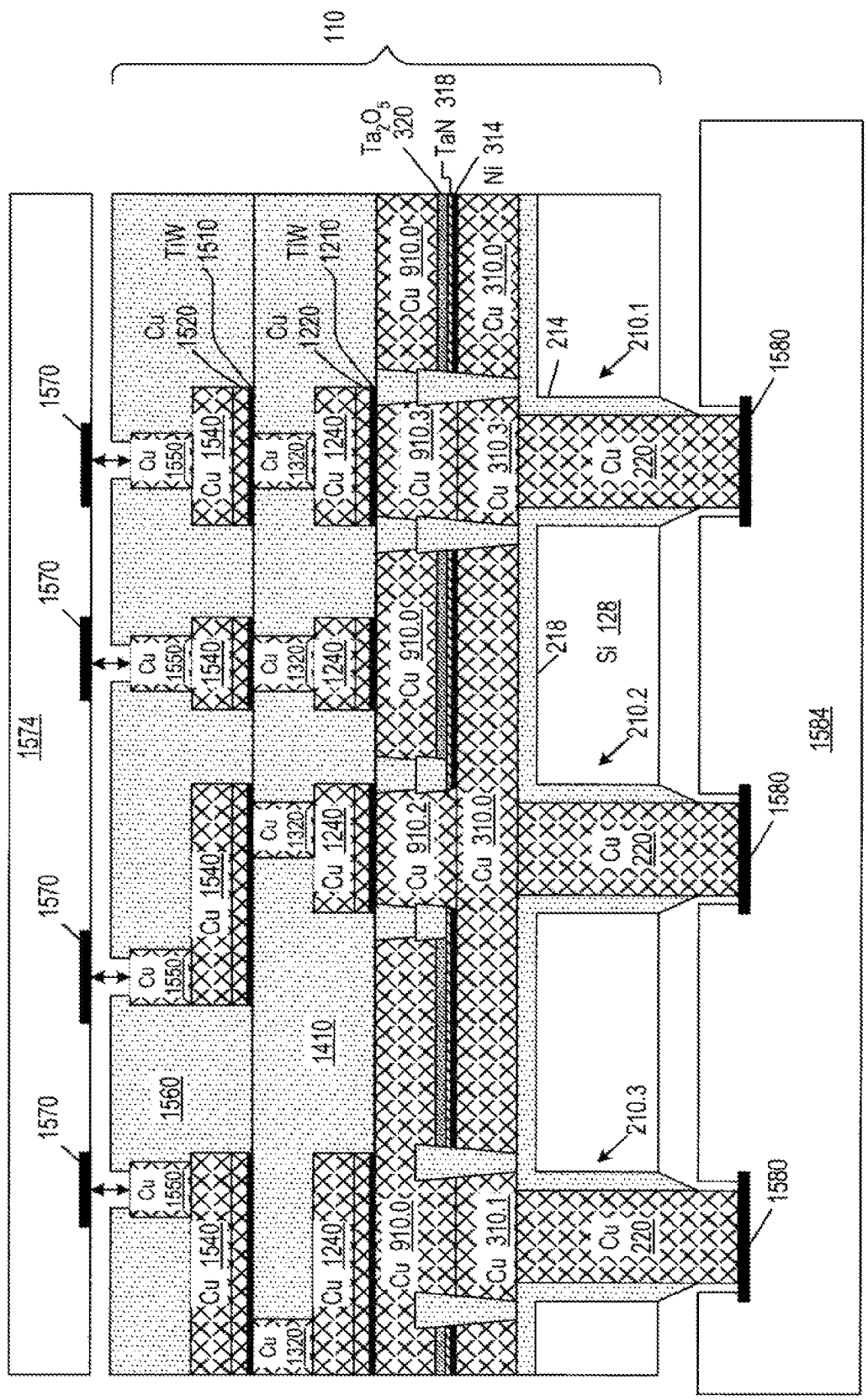
FIG. 15 is a vertical cross section of a packaged integrated circuit structure including an interposer according to some embodiments of the present invention.

The interposer fabrication can be completed using known techniques. Processes used in integrated circuit and printed circuit board fabrication, and possibly other processes, can be used for that purpose. In the example of FIG. 12, a titanium tungsten layer 1210 and then a copper seed layer 1220 are deposited on the entire wafer. Photoresist 1230 is formed on copper 1220 is patterned to define interconnect lines. Copper 1240 is electroplated in the areas exposed by the resist 1230. The resist is stripped, and another photoresist layer 1310 (FIG. 13) is deposited and patterned to define inter-level contacts 1320. These copper contacts are electroplated with the resist 1310 as a mask. The resist is stripped. A copper etch removes the seed layer 1220 in the areas not covered by the interconnects 1240. See FIG. 14. Copper layers 1240, 1320 may be reduced in thickness during this step. The etch stops on titanium tungsten 1210. Then the exposed portions of TiW 1210 are etched away between the interconnects 1240. A dielectric 1410 (e.g. polyimide) is deposited and polished to provide a planar top surface with the copper contacts 1320 being exposed. The steps of FIGS. 12-14 may be repeated any number of times to create a multi-level interconnect structure. For example, FIG. 15 shows an additional interconnect level including TiW 1510, copper 1520, copper 1540, copper 1550, and dielectric 1560. These layers are processed similarly to the respective layers 1210, 1220, 1240, 1320, and 1410, except that the dielectric 1560 is not polished down to the level of copper 1550. Rather, the dielectric is patterned photolithographically to expose the copper posts 1550. The copper posts 1550 provide contact pads that will be attached to contact pads 1570 of an overlying structure 1574 (e.g. a semiconductor integrated circuit). The attachment can be done by solder, wire bonding, or some other technique. In another embodiment (not shown), the dielectric 1560 is not patterned photolithographically but rather etched without a mask to a level below the top surface of copper 1550. Copper posts 1550 protrude at the top as a result. The copper posts can then be attached to contacts 1570 by solder, thermocompression or some other technique.

At some fabrication stage, possibly after the fabrication of layers 1550, 1560, and before or after the attachment of interposer 110 to structure 1574, the interposer's bottom surface is processed (e.g. polished and/or etched) to expose copper 220 in trenches 210. The processing involves removal of silicon 128 and oxide 214 at the bottom. This can be achieved by many techniques, known or to be invented. See e.g. the aforementioned U.S. Pat. Nos. 5,846,879; 5,767,001; 6,184,060; 6,322,903; 6,897,148. If the starting structure was as in FIG. 2B, this processing is omitted.

Copper contacts 220 at the bottom of the interposer can be attached to contacts 1580 of an underlying structure 1584 (e.g. a wiring substrate made of BT or some other material, or another interposer or some other integrated circuit) by solder, thermocompression, or some other technique.

Multiple capacitors can be formed in the interposer. They can be connected in parallel or in series. FIG. 16 shows a two-capacitor structure in the interposer. After the stage of FIG. 11, a dielectric (e.g. tantalum pentoxide) is formed on the wafer. In FIG. 16, numeral 1610 denotes a stack of nickel, tantalum nitride, and tantalum pentoxide layers formed by the same process as the layers 314, 318, 320. Other dielectrics and processes can also be used. The tantalum pentoxide sub-layer of layer 1610, and possibly also the nickel and tantalum nitride sub-layers, are patterned photolithographically to form openings over copper 910.0, copper 910.2, and copper 910.3. Then a new two-metal-layer capacitor structure is formed using the same techniques as for the bottom capacitor layers 310, 314, 318, 320, 910. The features of the new two-metal-layer capacitor structure are shown with the same reference numerals as for the bottom capacitor structure but with a suffix ".A". For example, the bottom and top capacitor plates of the new structure are marked respectively as 310.0.A and 910.0.A. The bottom capacitor plate 310.0 is connected to the plate 310.0.A by copper 910.2. Plate 910.0 is connected to plate 910.0.A by copper 310.1.A. Trench 410.A isolates copper 910.0.A and 310.1.A from plate 310.0.A. Trench 510.A isolates copper 910.2.A and plate 310.0.A from plate 910.0.A. Trench 414.A merges with trench 414 (FIG. 11) to isolate a conductive path between metallized hole 210.3 and the top of the interposer from the capacitor electrodes. Other variations are also possible. For example, the top capacitor does not have to be connected in parallel to the bottom capacitor. The two capacitors can be connected in series or disconnected. More than two capacitors can be provided. Additional capacitors can be formed at the stage of FIG. 14 or some other stages. Non-decoupling capacitors can also be formed.

In some embodiments, the techniques used to form a capacitor electrode can be used to form instead (or in addition) a ground plane or a power plane to provide electromagnetic shielding of between circuitry above the plane and circuitry below the plane.

Exemplary dimensions believed achievable in some embodiments are as follows. The inner radius of each of trenches 410, 414A (FIG. 4A), as measured in photoresist 430, can be 85 µm. The outer radius as measured in the resist can be 105 µm. The actual outer radius of each of these trenches right below the dielectric 320 is 111 µm. The trench width at the bottom is 10-15 µm. In some embodiments, each capacitor plate 310.0, 910.0, 310.0.A, 910.0.A covers about 85% of the interposer area. These dimensions are not limiting.

The invention is not limited to the embodiments described above. For example, the trenches 510 (FIG. 11) do not have to be vertically aligned with holes 210. FIG. 17 shows two trenches 510 around respective two copper portions 910.2 of layer 910. Trenches 510 are laterally shifted relative to metallized hole 210.2, and are smaller in top view than hole 210.2. In some embodiments, the size and the distance between the adjacent holes 210 are dictated by the minimal size and pitch requirements achievable for contacts 1580 (FIG. 15). These minimal size and pitch dimensions may be larger than the dimensions obtainable for the copper portions 910.2. In some embodiments, two, three, or some other number of copper portions 910.2 are placed between two adjacent holes 210 (e.g. holes 210.1, 210.2). In a similar manner, in FIG. 16, multiple copper portions 910.2.A can be placed above copper 310.0.A and can be laterally shifted relative to copper 910.2.

Non-metal conductive materials can be used instead of copper. Some embodiments use dielectrics other than polyimide or tantalum pentoxide. Trenches 410, 414, 510 do not have to be circular. Some embodiments do not use a semiconductor substrate. The features described above do not have to be used together. For example, the use of nickel barrier layer for tantalum anodization is appropriate in structures that do not have dielectric trenches such as trenches 410, 414, 510; and vice versa (dielectric trenches can be used without the tantalum anodization techniques described above). The CMP techniques described above in connection with FIG. 7 can be used independently of the tantalum anodization techniques and the dielectric trenches. Other embodiments and variations are within the scope of the invention, as defined by the appended claims.

The invention claimed is:

1. A structure comprising an integrated circuit comprising
a semiconductor substrate;
a first conductive feature overlying the semiconductor substrate;
one or more second conductive features overlying the semiconductor substrate;
one or more first dielectric trenches completely laterally surrounding the second conductive features and separating the second conductive features from the first conductive feature;
wherein the first conductive feature completely laterally surrounds the first dielectric trenches;
a third conductive feature overlying the first and second conductive features and physically contacting each second conductive feature;
one or more fourth conductive features overlying and physically contacting the first conductive feature;
one or more second dielectric trenches completely laterally surrounding the fourth conductive features and separating the fourth conductive features from the third conductive feature, wherein the third conductive feature completely laterally surrounds the second dielectric trenches;
third dielectric overlying the first conductive feature and separating the first conductive feature from the third conductive feature;
wherein the third dielectric physically contacts the one or more first dielectric trenches.

2. The structure of claim 1 wherein each first dielectric trench completely laterally surrounds a respective one second conductive feature, and the first conductive feature completely laterally surrounds and physically contacts each first dielectric trench.

3. The structure of claim 1 wherein each second dielectric trench completely laterally surrounds a respective one fourth conductive feature, and the third conductive feature completely laterally surrounds and physically contacts each second dielectric trench.

4. The structure of claim 1 wherein each second feature is substantially co-planar with the first feature, and each fourth feature is substantially co-planar with the third feature.

5. The structure of claim 1 further comprising, under each second feature, a conductive member passing through a through-hole in the semiconductor substrate and physically contacting the second feature, the conductive member being insulated from the first feature.

6. The structure of claim 1 further comprising a conductive member passing through a through-hole in the semiconductor substrate and physically contacting the first feature, the conductive member being insulated from the second features.

7. The structure of claim 1 wherein the first conductive feature comprises:
a first portion comprising copper; and
a second portion overlying the first portion and comprising nickel; and
wherein the third dielectric overlies and physically contacts the second portion but not the first portion, the third dielectric comprising tantalum oxide.

8. The structure of claim 7 wherein the second portion consists essentially of nickel, and the first portion consists essentially of copper.

9. The structure of claim 1 wherein each of the first and third conductive features covers at least 80% of the whole area of the integrated circuit.

10. A structure comprising an integrated circuit comprising:
a semiconductor substrate;
a first conductive feature overlying the semiconductor substrate;
one or more second conductive features overlying the semiconductor substrate;
one or more first dielectric trenches completely laterally surrounding the second conductive features and separating the second conductive features from the first conductive feature;
wherein the first conductive feature completely laterally surrounds the first dielectric trenches;
wherein the integrated circuit further comprises:
a third conductive feature overlying the first and second conductive features and physically contacting each second conductive feature;
one or more fourth conductive features overlying and physically contacting the first conductive feature;
one or more second dielectric trenches completely laterally surrounding the fourth conductive features and separating the fourth conductive features from the third conductive feature, wherein the third conductive feature completely laterally surrounds the second dielectric trenches;
third dielectric overlying the first conductive feature and separating the first conductive feature from the third conductive feature;
wherein:
the first conductive feature comprises a first material and a barrier material separating the first material from the third dielectric; and
the first material physically contacts the one or more first dielectric trenches, without the barrier material between the first material and the one or more first dielectric trenches.

11. A structure comprising an integrated circuit comprising:
a semiconductor substrate;
a first conductive feature overlying the semiconductor substrate;
one or more second conductive features overlying the semiconductor substrate;
one or more first dielectric trenches completely laterally surrounding the second conductive features and separating the second conductive features from the first conductive feature;
wherein the first conductive feature completely laterally surrounds the first dielectric trenches;
wherein the integrated circuit further comprises:
a third conductive feature overlying the first and second conductive features and physically contacting each second conductive feature;
one or more fourth conductive features overlying and physically contacting the first conductive feature;
one or more second dielectric trenches completely laterally surrounding the fourth conductive features and separating the fourth conductive features from the third conductive feature, wherein the third conductive feature completely laterally surrounds the second dielectric trenches;

third dielectric overlying the first conductive feature and separating the first conductive feature from the third conductive feature;

wherein the one or more first dielectric trenches extend upward higher than the third dielectric and into the third conductive feature, the third conductive feature having a bottom surface which physically contacts each first dielectric trench both on top and on each side of the first dielectric trench.

\* \* \* \* \*